US008815012B2

(12) United States Patent
Kelekar

(10) Patent No.: US 8,815,012 B2
(45) Date of Patent: Aug. 26, 2014

(54) EMISSIVITY PROFILE CONTROL FOR THERMAL UNIFORMITY

(71) Applicant: Intermolecular, Inc., San Jose, CA (US)

(72) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 1 day.

(21) Appl. No.: 13/738,272

(22) Filed: Jan. 10, 2013

(65) Prior Publication Data
US 2014/0080322 A1 Mar. 20, 2014

Related U.S. Application Data

(63) Continuation of application No. 13/019,268, filed on Feb. 1, 2011, now Pat. No. 8,465,590.

(51) Int. Cl.
*H05B 6/10* (2006.01)
*H01L 21/67* (2006.01)
*H01L 21/687* (2006.01)
*H01L 21/02* (2006.01)
*H01L 21/324* (2006.01)

(52) U.S. Cl.
CPC ........ *H01L 21/324* (2013.01); *H01L 21/67109* (2013.01); *H05B 6/105* (2013.01); *H01L 21/68757* (2013.01); *H01L 21/02002* (2013.01); *H01L 21/67115* (2013.01)
USPC .............................................. 118/715; 374/2

(58) Field of Classification Search
USPC .............. 118/500, 715, 725; 374/2, 110, 126, 374/128
See application file for complete search history.

(56) References Cited

U.S. PATENT DOCUMENTS 5,782,979 A * 7/1998 Kaneno et al. ................ 118/500

* cited by examiner

*Primary Examiner* — Thomas L Dickey

(57) ABSTRACT

A substrate for processing in a heating system is disclosed. The substrate includes a bottom portion for absorbing heat from a radiating heat source, the bottom portion having a first region having a first emissivity and a second region having a second emissivity less than the first emissivity. The first region and the second region promote thermal uniformity of the substrate by compensating for thermal non-uniformity of the radiating heat source.

18 Claims, 7 Drawing Sheets

Cross — section of Chamber

Cross – section of Chamber

EMISSIVITY PROFILE CONTROL FOR THERMAL UNIFORMITY

RELATED APPLICATIONS

This is a Continuation application of U.S. patent application Ser. No. 13/019,268, filed on Feb. 1, 2011, which is herein incorporated by reference for all purposes.

This application is related to U.S. patent application Ser. No. 12/963,425, filed Dec. 8, 2010, which is herein incorporated by reference in its entirety for all purposes.

This invention is based on research sponsored by DARPA/Defense Microelectronics Activity (DMEA) under agreement number H94003-10-2-1003. The United States Government has certain rights to this invention and is authorized to reproduce and distribute reprints for Government purposes, notwithstanding any copyright notation thereon.

BACKGROUND

Semiconductor processes may utilize induction heating to heat a wafer to high temperatures (~1000° C.). In induction heating, an alternating current in an inductor coil induces eddy currents in a nearby conducting material called a susceptor, which is in close proximity to a substrate/wafer. These eddy currents generate heat within the susceptor and cause the temperature of the susceptor to rise. The susceptor in turn radiates heat in net to its surroundings. A portion of this net radiated heat flux is absorbed by the wafer and causes the wafer temperature to rise. As the wafer increases in temperature, it also loses heat to its surroundings. When the heat absorbed balances the heat lost by the wafer, the wafer temperature stabilizes.

An important concern when heating a wafer is the thermal uniformity of the wafer in equilibrium. The uniformity depends on the radiated heat from the susceptor, which in turn depends on the power density profile induced by the inductor coil. The temperature profile of the wafer will closely match the power density profile of the inductor coil. It is very difficult to obtain a uniform power density profile in most cases. Common solutions, such as locating the wafer eccentrically to the susceptor and rotating the wafer, typically involve the addition of complicated, expensive hardware.

It is in this context that embodiments of the invention arise.

SUMMARY

Embodiments of the present invention provide systems and methods for processing a substrate. According to embodiments of the invention, a substrate is heated by a radiating heat source, such as an inductively heated susceptor. Non-uniform heating of the heat source is compensated for by variably absorbing heat at the bottom of the substrate or variably transmitting heat at the top surface of the heat source or susceptor, so as to provide substantially uniform heating of the substrate. The variable absorption or transmission of heat is enabled by providing regions having differing emissivities on the bottom surface of the substrate or the top surface of the susceptor. Several inventive embodiments of the present invention are described below.

In one aspect of the invention, a substrate for processing in a heating system is provided. The substrate includes a bottom portion for absorbing heat from a radiating heat source, the bottom portion having a first region having a first emissivity and a second region having a second emissivity less than the first emissivity. In one embodiment, the first region and the second region promote thermal uniformity of the substrate by compensating for thermal non-uniformity of the radiating heat source.

In another embodiment, a susceptor for heating a substrate in an induction heating system is provided. The susceptor has a top surface for transmitting heat to the substrate, the top surface having a first region having a first emissivity and a second region having a second emissivity less than the first emissivity. In one embodiment, the first region and the second region promote uniform thermal transmission across the top surface of the susceptor.

In one embodiment, a method for heating a substrate in an induction heating system is provided. According to the method, a substrate is disposed above a susceptor. The susceptor is inductively heated in a non-uniform manner. The non-uniform heating of the susceptor is compensated for by variably absorbing heat at a bottom surface of the substrate or variably transmitting heat of the susceptor at a top surface of the susceptor, so as to provide substantially uniform heating of the substrate. In one embodiment, the method operation of variably absorbing heat at the bottom surface of the substrate includes absorbing heat through a first bottom surface portion having a first emissivity and absorbing heat through a second bottom surface portion having a second emissivity less than the first emissivity. In another embodiment, the method operation of variably transmitting heat of the susceptor at the top surface of the susceptor includes transmitting heat through a first top surface portion having a first emissivity and transmitting heat through a second top surface portion having a second emissivity less than the first emissivity.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

The embodiments described herein provide a method and system for processing a substrate. According to embodiments of the invention, a substrate is heated by a radiating heat source, such as an inductively heated susceptor. Non-uniform heating of the heat source is compensated for by variably absorbing heat at the bottom of the substrate or variably transmitting heat at the top surface of the heat source or susceptor, so as to provide substantially uniform heating of the substrate. It will be obvious, however, to one skilled in the art, that the present invention may be practiced without some or all of these specific details. In other instances, well known process operations have not been described in detail in order not to unnecessarily obscure the present invention.

Figure 1:
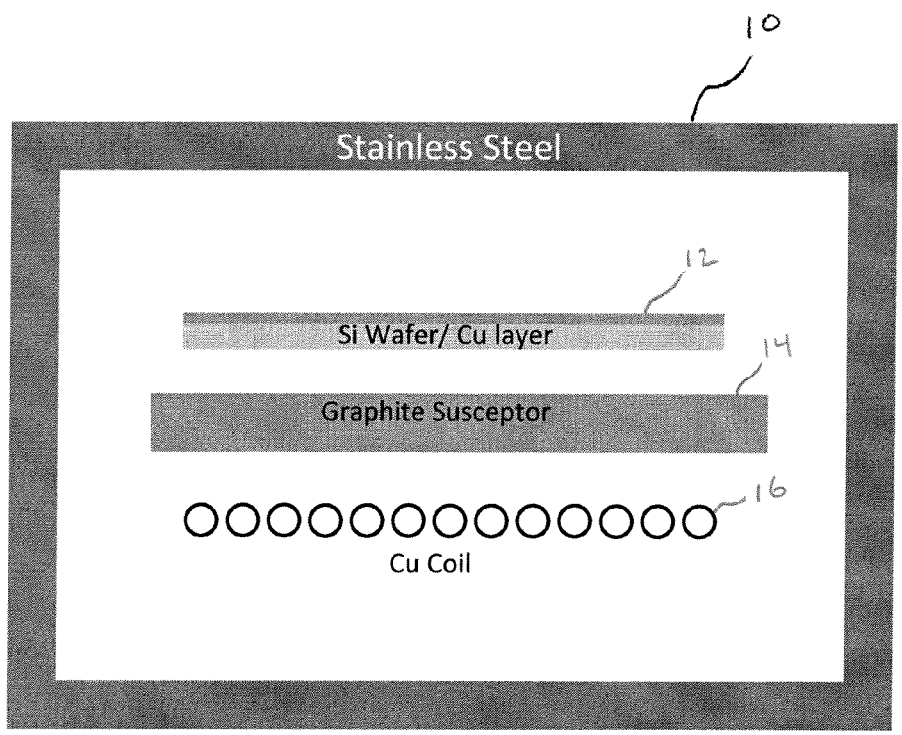
FIG. 1 illustrates a cross-section view of a reaction chamber configured for inductive heating, in accordance with an embodiment of the invention.

FIG. 1 illustrates a cross-section view of a reaction chamber configured for inductive heating, in accordance with an embodiment of the invention. As shown, the reaction chamber includes chamber walls 10 for containment. A substrate 12 is disposed above a susceptor 14, which in turn is disposed above a coil 16. During operation, the coil 16 is supplied with a current, which thereby generates an electromagnetic field. The electromagnetic field induces eddy currents in the susceptor 14, causing the susceptor to heat. As the susceptor 14 is heated by the coil 16, the susceptor 14 in turn radiates heat to the substrate 12. The substrate 12 absorbs the radiated heat. As the substrate 12 is heated, the substrate also radiates heat. It should be appreciated that when the rate of heat being radiated by the substrate 12 equals the rate at which the substrate is absorbing heat, then the temperature of the substrate 12 stabilizes.

The substrate 12 may include any of various types of substrate materials, such as silicon, silicon oxide, gallium arsenide, silicon nitride, magnesium oxide, aluminum oxide, or other materials. Likewise, the susceptor 14 may include a graphite material or other types of materials which are useful for being heated via the coil 16.

In the illustrated embodiment, the coil 16 is formed as a planar spiral oriented along a plane parallel to the top or bottom surfaces of the susceptor or substrate. In one embodiment, the coil 16 is composed of a copper tube. However, it will be appreciated by those skilled in the art that in other embodiments, the coil 16 may have other shapes and configurations, and may be composed of other materials, so as to provide adequate generation of an electromagnetic field capable of inductively heating the susceptor 14. The susceptor 14 is composed of any suitable material which may be inductively heated when a current is applied to the coil 16, and which radiates heat. By way of example only, in one specific embodiment, the susceptor is composed of graphite.

The present description of an inductive heating system is provided by way of example only, and not by way of limitation. In various embodiments of the invention, any of various kinds of inductive heating systems having various configurations of substrates, susceptors, and coils are contemplated. Further examples of inductive heating systems are provided in U.S. patent application Ser. No. 12/963,425.

The current density induced in the susceptor 14 is typically non-uniform due to non-uniformity of the magnetic flux generated by the coil 16 and/or due to skin and edge effects. Since the power density is proportional to the square of the current density, the power density in the susceptor 14 will also be non-uniform. Furthermore, as the temperature distribution is dependent on the power density distribution, the temperature profile of the susceptor 14 will be non-uniform and result in a similar non-uniform heat flux radiated by the susceptor 14 to the substrate 12.

The transfer of heat from the susceptor 14 to the substrate 12 is proximity dependent in that the closer the substrate is positioned to the susceptor 14, the more closely the heat distribution of the substrate 12 will mirror that of the susceptor 14. Therefore, the effects of non-uniform heat distribution in the susceptor 14 may be somewhat mitigated by positioning the substrate away from the susceptor 14. However, this will result in a loss in efficiency of heat transfer between the susceptor 14 and the substrate 12. Furthermore, heat from the susceptor 14 will be lost to the surroundings, causing heating of the chamber itself, which may be undesirable. Therefore, the extent to which the proximity of the substrate 12 from the susceptor 14 may be adjusted to mitigate non-uniform heating of the susceptor 14 is limited. It will be appreciated by those skilled in the art that in some embodiments of the invention, the substrate 12 rests directly on top of the susceptor 14, while in other embodiments, the substrate 12 is spaced apart from the susceptor 14, thereby mitigating to a certain extent thermal non-uniformity of the susceptor.

Figure 2A:
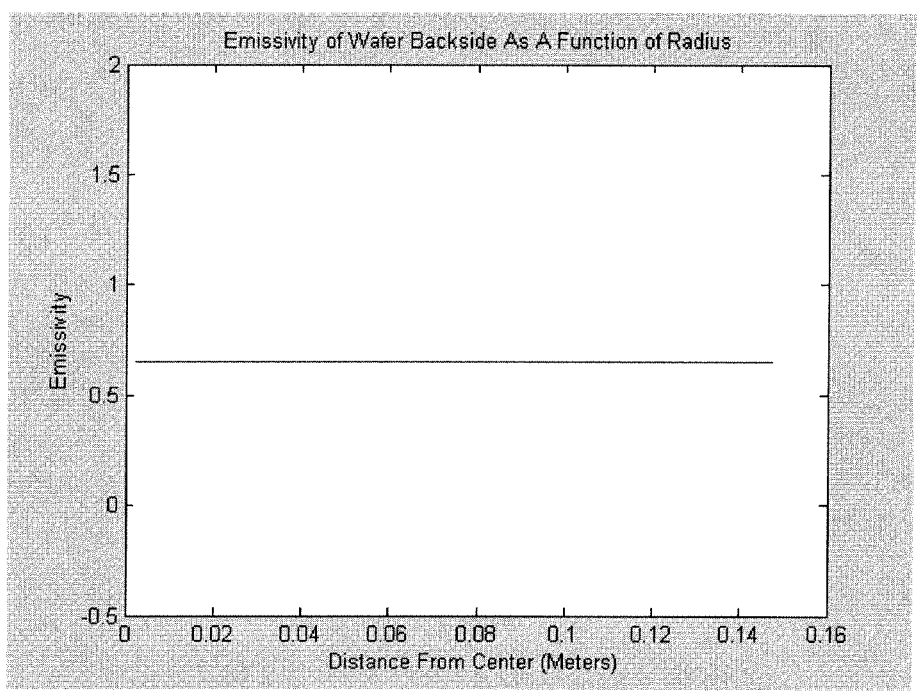
FIG. 2A illustrates the emissivity profile of the backside of a conventional substrate, in accordance with an embodiment of the invention.

FIG. 2A illustrates the emissivity profile of the backside of a conventional substrate, in accordance with an embodiment of the invention. In an inductive system as herein described, the backside of the substrate faces an opposing surface of the susceptor, absorbing heat radiated by the susceptor. In the illustrated graph, emissivity as a function of distance from the center of the substrate is shown. The emissivity profile shown is of a substrate backside consisting of uniform polished silicon, and as can be seen, the substrate has a constant emissivity of about 0.65 throughout its radius. A uniform backside surface will produce an emissivity profile such as the one shown, having a constant value throughout its radius.

Figure 2B:
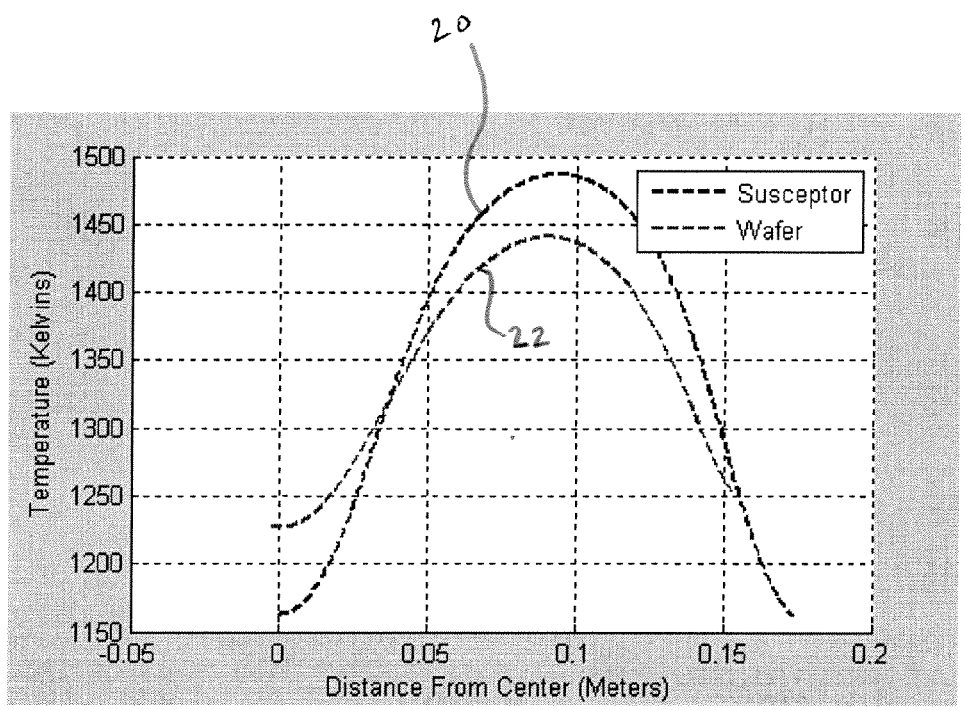
FIG. 2B illustrates temperature profiles of a susceptor and a substrate, the substrate having a uniform backside surface and being heated by the susceptor, in accordance with an embodiment of the invention.

FIG. 2B illustrates temperature profiles of a susceptor and a substrate, the substrate having a uniform backside surface and being heated by the susceptor, in accordance with an embodiment of the invention. The curve 20 represents the temperature within the susceptor as a function of distance from the center of the susceptor, whereas the curve 22 similarly represents the temperature within the substrate as a function of distance from the center of the substrate. The centers of the susceptor and substrate are aligned in this embodiment. As the emissivity of the backside of the substrate is constant, the temperature distribution in the substrate is similar to that of the susceptor. In the illustrated graph, the temperature distribution of the susceptor demonstrates a pronounced rise at moderate distances from the center. Similarly, the temperature distribution of the substrate demonstrates a similar pronounced rise at moderate distances from the center. Overall, the substrate exhibits a temperature variation of over 200 Kelvin (K) due to the non-uniform temperature distribution in the susceptor.

Figure 3:
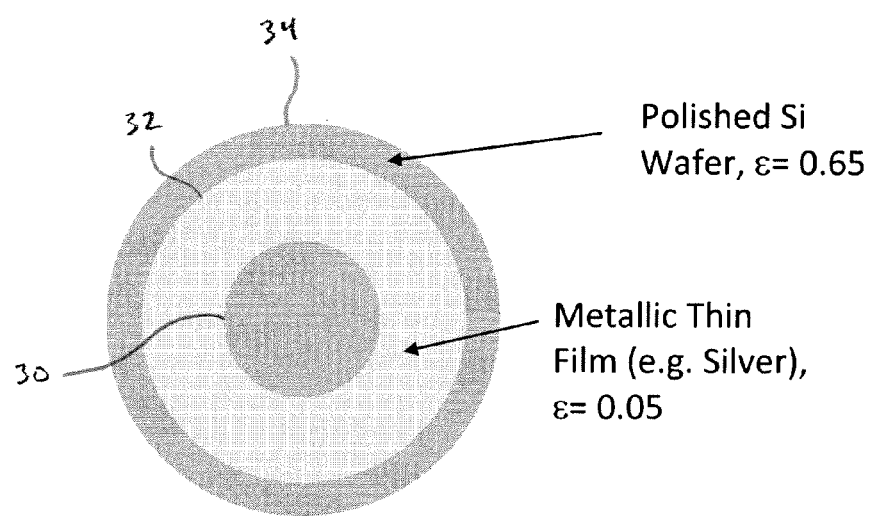
FIG. 3 illustrates a bottom portion of a substrate having a variable emissivity profile, in accordance with an embodiment of the invention.

FIG. 3 illustrates a bottom portion of a substrate having a variable emissivity profile, in accordance with an embodiment of the invention. A first region 30 having a first emissivity, a second region 32 having a second emissivity, and a third region 34 having a third emissivity are shown. In one embodiment, the second emissivity of the second region 32 is less than the first emissivity of the first region 30. In another embodiment, the third emissivity of the third region 34 is equivalent to the first emissivity of the first region 30, whereas in other embodiments, the third emissivity may differ from the first emissivity. The different regions and their respective emissivity values provide a bottom surface having variable emissivity to compensate for thermal non-uniformity of a radiating heat source (such as an inductively heated susceptor). Accordingly, thermal uniformity is promoted in the substrate having a variable emissivity profile when the substrate is heated by the radiating heat source.

Various approaches may be utilized to produce a bottom surface of a substrate having variable emissivity. For example, in one embodiment, a thin film is deposited over the bottom portion of a substrate so as to modify its emissivity profile. As applied with reference to FIG. 3, in one embodiment, the bottom portion of the substrate is composed of polished silicon. A thin film is deposited as an annular ring-shaped area that defines the second region 32. The first region 30 and third region 34 constitute exposed surfaces of the polished silicon which forms part of the bottom portion of the substrate in one embodiment.

The thin film may be deposited according to any of various thin film deposition methods, such as chemical vapor deposition, physical vapor deposition, sputtering, atomic layer deposition, etc. Pattern/masking technologies may be employed to achieve the specific shape, width, or position of the deposited thin film. The thin film material may be any material having a suitable emissivity value for promoting thermal uniformity of the substrate when heated. In some embodiments, the thin film material may be a metallic material, such as silver, copper, molybdenum, or other metallic materials. In other embodiments, the thin film material may be a non-metallic material having a suitable emissivity value.

The thin film has a thickness sufficient to provide complete coverage of the underlying material. Thus, the thickness required may depend upon the material deposited and the method of deposition. In some embodiments, the thin film has a thickness of approximately less than 500 nanometers. In other embodiments, the thin film has a thickness of approximately less than 100 nanometers.

Furthermore, as roughness of a thin film affects emissivity, the thin film can be deposited so as to have a suitable roughness for achieving a desired level of emissivity. In general, the emissivity of a thin film material is positively correlated with its surface roughness. Thus, a rougher surface tends to promote increased emissivity, whereas a smoother surface generally exhibits lower emissivity. The surface roughness of a thin film can be measured by various techniques, such as atomic force microscopy, x-ray reflectivity, and polarized light scattering. Average length scales of the peaks and valleys of the film surface are typically quantified in units of Angstroms or nanometers. By way of example, in one embodiment, the thin film may be deposited so as to be conformal with the underlying surface roughness of the bottom portion of the substrate. In other embodiments, the thin film can be deposited to a thickness sufficient for the thin film material's inherent roughness to be attained, which may be less or more than that of the underlying surface of the substrate backside. It will be noted by those skilled in the art, that in various embodiments, the roughness of a thin film may be controlled so as to achieve a desired level of emissivity.

In other embodiments, a bottom layer of the substrate may be fashioned to include portions of differing materials which have different emissivity values. For example, in one embodiment, a bottom layer of a substrate may be patterned, and a material having a different emissivity value may be deposited to fill the pattern. The surface may subsequently undergo planarization and/or polishing to expose a smooth level bottom surface having the desired configuration of various surface regions with differing emissivity values. It will be appreciated by those skilled in the art that in other embodiments, various other approaches may be applied to achieve a bottom surface of a substrate having variable emissivity in accordance with embodiments of the invention herein described.

Figure 4A:
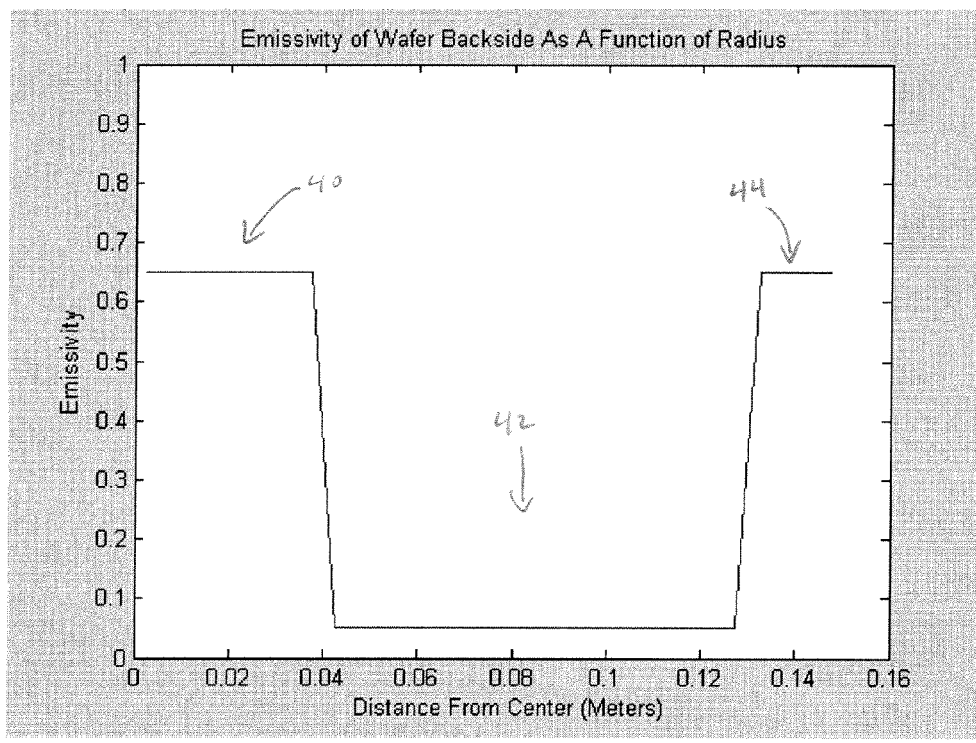
FIG. 4A illustrates an emissivity profile for a backside of a substrate, in accordance with an embodiment of the invention.

FIG. 4A illustrates an emissivity profile for a backside of a substrate, in accordance with an embodiment of the invention. The illustrated curve shows emissivity as a function of radius for a substrate as discussed above with reference to FIG. 3, wherein a silver thin film is deposited over a polished silicon bottom portion of the substrate. The portions 40 and 44 of the curve correspond to first region 30 and third region 34 of the substrate of FIG. 3, respectively, which are exposed portions of polished silicon. The portion 42 corresponds to second region 32 of the substrate of FIG. 3, which is a silver thin film region. As shown, the portions 40 and 44 (polished silicon) exhibit an emissivity value of about 0.65. The portion 42 (silver thin film) exhibits an emissivity of about 0.05.

Figure 4B:
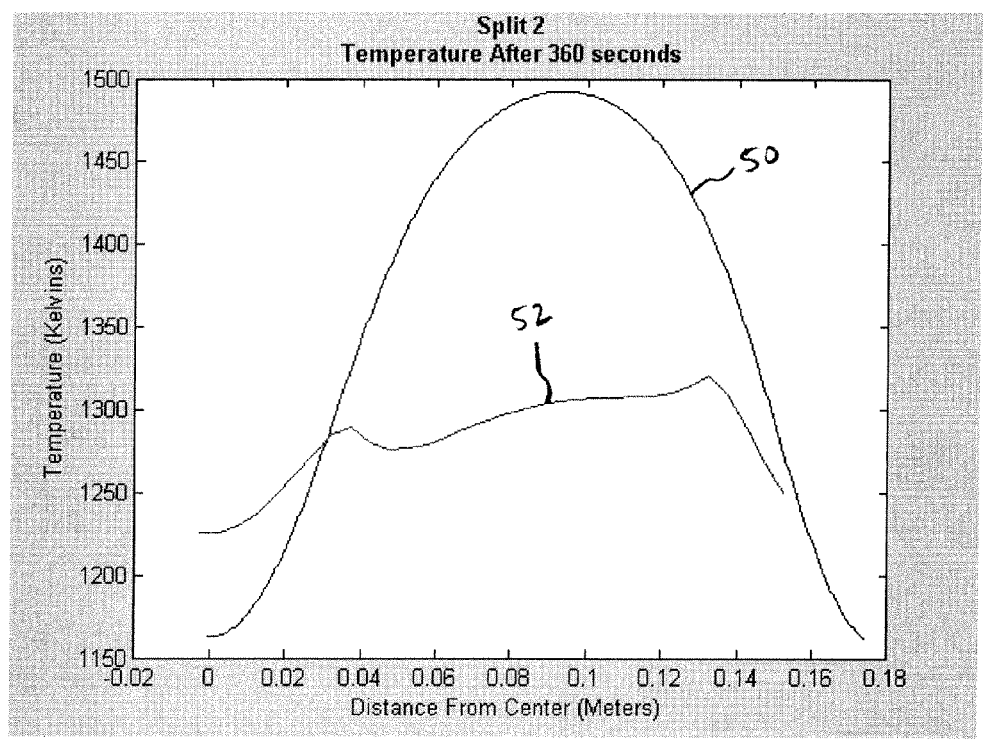
FIG. 4B illustrates a graph of temperature as a function of distance from the center for a susceptor and a substrate heated by the susceptor, in accordance with an embodiment of the invention.

FIG. 4B illustrates a graph of temperature as a function of distance from the center for a susceptor and a substrate heated by the susceptor, in accordance with an embodiment of the invention. The substrate has an emissivity profile as described with reference to FIG. 4A. A curve 50 illustrates the temperature variation in the susceptor as a function of radius. As shown, the temperature of the susceptor varies by over 300 K, having cooler temperatures at both the center and edge, but noticeably higher temperatures at intermediate distances from the center.

The curve 52 illustrates the temperature of the substrate as a function of radius, the substrate being heated by the susceptor. Because the substrate has a variable emissivity profile, with higher emissivity towards the center and the edge, and lower emissivity at intermediate distances from the center, heat is absorbed to a greater extent at the center and edge, and to a lesser extent at intermediate distances from the center. As demonstrated by curve 52, there is considerably less temperature variation in the substrate, on the order of less than 100 K, despite the much larger temperature variation of the susceptor. Thus, the configuration of the substrate to have variable emissivity compensates for the thermal non-uniformity of the susceptor to provide relative thermal uniformity of the substrate. This compares favorably to the graph shown at FIG. 2B, wherein the susceptor has a uniform backside emissivity, and consequently a large non-uniform temperature variation that mimics that of the susceptor.

Embodiments of the invention provide improved thermal uniformity of a substrate when heated by a radiating heat source. It will be noted that for a given application, temperature uniformity in the substrate may be defined with reference to variation of temperature in the substrate as well as the temperature range to which the substrate is heated. Merely by way of example, in some embodiments, thermal uniformity of the substrate may be achieved by attaining a temperature variation in the substrate of less than 10% when heated to a temperature range of between 400 K and 2000 K. In other embodiments, thermal uniformity of the substrate is achieved by attaining a temperature variation of less than 5% when heated to between 400 K and 2000 K. It will be apparent to those skilled in the art that in various embodiments, the emissivity profile of the substrate may be modified to achieve a thermal uniformity suitable for the particular application, which may be a suitably defined temperature variation when the substrate is heated to a particular temperature range.

Furthermore, it will be noted by those skilled in the art that modification of the emissivity profile of a substrate is especially useful at pressures where radiation heat transfer begins to dominate conduction heat transfer. In some embodiments, this occurs at pressures of approximately less than 10 Torr.

The foregoing embodiments have generally been described with reference to a substrate backside surface having a single annular ring-shaped region having an emissivity less than the surrounding regions. However, it will be understood by those skilled in the art that in other embodiments of the invention, the backside surface of the substrate may be configured to have any number of regions of varying emissivity and shape. For example, in one embodiment, several different annular rings utilizing multiple materials of different emissivities may be formed on a substrate backside. The specific configuration of surface types and their geometry and position can be determined in order to promote uniform heating of the substrate by compensating for non-uniformity of the radiating heat source. This may be accomplished by configuring the substrate to have regions of higher emissivity which align with cooler regions of the radiating heat source, and regions of lower emissivity which align with hotter regions of the radiating heat source. It will be appreciated that any number of different materials having different levels of emissivity may be incorporated into a specific configuration for a particular radiating heat source and substrate.

It will be noted that regions of varying emissivity may have any size which may be formed on the backside surface of the substrate. For example, regions may be macroscopic, near-microscopic or even microscopic in scale. In one embodiment, a number of very small, perhaps microscopic, regions are deposited on a bottom portion of a substrate. The emissivity of the deposited regions is less than the emissivity of the material comprising the bottom portion of the substrate (e.g. silicon) in one embodiment. The regions are arranged so a higher density of regions exists on areas of the substrate which align with hotter portions of a radiating heat source, whereas a lower density of regions exists on areas of the substrate which align with cooler portions of the radiating heat source. The varying density of the regions may therefore compensate for thermal non-uniformity of the radiating heat source.

Additionally, in alternative embodiments of the invention, the above-described principles may be applied to modify the emissivity profile of the radiating heat source. In other words, the surface of the radiating heat source, such as a susceptor in an inductive heating system, may be configured to have regions of different emissivity levels. In this manner, the radiating heat source itself can be configured to compensate for its own thermal non-uniformity by altering the surface so as to radiate heat in a more uniform manner. This may be accomplished by configuring the radiating heat source to have surface regions of higher emissivity over those portions which are cooler, and surface regions of lower emissivity over those portions which are hotter. It will be apparent that any number of techniques, such as thin-film deposition techniques as previously described, may be employed to form the requisite surface regions. Furthermore, the various surface regions may have any number of different materials of different emissivities, and varying shape and arrangement. It will be apparent that configuration of the substrate-facing surface of the radiating heat source may be utilized in conjunction with configuration of the backside surface of the substrate to achieve desirable heating properties.

Furthermore, while embodiments of the invention have generally been described so as to provide uniform heating of a substrate, it will be understood by those skilled in the art that in other embodiments, one may utilize the principles of the present invention to intentionally promote non-uniform heating of the substrate in a specified manner. In other words, by controlling the emissivity profile of a substrate backside or of a substrate-facing portion of a radiating heat source, it is possible to heat selected portions of the substrate to a greater extent than other portions. In this manner, a differential heating profile may be achieved for the substrate. This may be well suited for experimental purposes to enable simultaneous evaluation of a variety of temperature conditions, or for protecting portions of a substrate which may be sensitive to heat, while enabling application of heat to those portions which require it.

It will be appreciated that embodiments of the invention and the principles discussed herein may be applied to any process which requires heating of a substrate. Applicants have found the embodiments of the present invention to be notably useful for high-temperature processes, such as graphene deposition and titanium nitride deposition, where significant thermal non-uniformity issues are likely to arise.

While embodiments of the invention have generally been described with reference to inductive heating systems, it will be appreciated by those skilled in the art that in other embodiments the principles of the present invention may be applied to any system utilizing a radiating heat source to heat a substrate. Thus, by way of example, it is contemplated that in other embodiments, the above-described principles of the present invention may be applied to resistive heating systems, infrared (IR) heating systems, or other types of heating systems.

Figure 5:
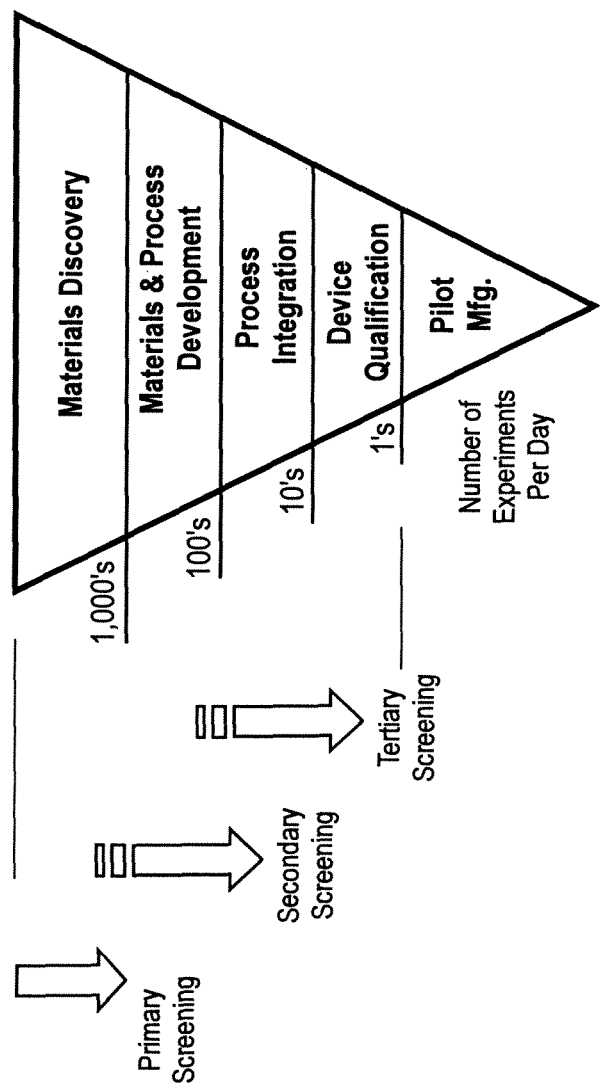
FIG. 5 is a simplified schematic diagram illustrating an overview of a High-Productivity Combinatorial (HPC) screening process for use in evaluating materials, unit processes, and process sequences for the manufacturing of semiconductor devices in accordance with one embodiment of the invention.

FIG. 5 is a simplified schematic diagram illustrating an overview of a High-Productivity Combinatorial (HPC) screening process for use in evaluating materials, unit processes, and process sequences for the manufacturing of semiconductor devices in accordance with one embodiment of the invention. As illustrated in FIG. 5, primary screening incorporates and focuses on materials discovery. Here, the materials may be screened for certain properties in order to select possible candidates for a next level of screening. In the initial primary screening there may be thousands of candidates which are subsequently reduced to hundreds of candidates. These hundreds of candidates can then be used or advanced to secondary screening processes which will look at materials and unit processes development. In the secondary screening level, process integration may be additionally considered to narrow the candidates from hundreds of candidates to tens of candidates. Thereafter, tertiary screening further narrows these candidates through process integration and device qualification in order to identify some best possible optimizations in terms of materials, unit processes and process sequence integration.

The above-described techniques for emissivity profile control can be utilized in any of the primary, secondary, or tertiary screening procedures. For example, emissivity profile control can be utilized to enhance thermal uniformity of a substrate during processing or evaluation operations, thereby providing better quality results. In another example, emissivity profile control can be utilized to intentionally heat substrates in a differential manner, enabling a variety of temperature conditions to be simultaneously generated and evaluated on a single substrate.

In one embodiment, the primary and secondary testing may occur on a coupon, while the tertiary testing is performed on a production size wafer. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels. Thereafter, secondary screening may take the most promising candidates from the primary screening and perform further experiments.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

In the various screening levels, the process tools may be the same or may be different. For example, in dry processing the primary screening tool may be a combinatorial sputtering tool available described, for example, in U.S. Pat. No. 5,985,356. This tool is efficient at preparing multi-material samples in regions for simple materials properties analysis. For secondary and/or tertiary screening technique, a modified cluster tool may be retrofitted with a combinatorial chamber. As another example, in wet processing, the primary and secondary screening can be implemented in a combinatorial tool. The main differences here are not the capabilities of the tools, but the substrates used, the process variations or structures created and the testing done. For the tertiary tool, a wet reactor with combinatorial and non-combinatorial chambers described in U.S. application Ser. No. 11/647,881, could be used for integrated and more sophisticated processing and analysis.

In the development or screening cycle, typically there are many materials synthesized or processed involving large permutations of a plurality of materials, a plurality of processes, a plurality of processing conditions, a plurality of material application sequences, a plurality of process integration sequences, and combinations thereof. Testing of these many materials may use a simple test, such as adhesion or resistivity and may involve a blanket wafer (or coupon) or one with basic test structures to enable testing for one or more desired properties of each material or unit process. Once the successful materials or unit processes have been selected, combinatorial techniques are applied to analyze these materials or processes within a larger picture. That is, the combinatorial techniques determine whether the selected materials or unit processes meet more stringent requirements during second stage testing. The processing and testing during the second stage may be more complex, e.g., using a patterned wafer or coupon, with more test structures, larger regions, more variations, more sophisticated testing, etc. For example, the structure defined by the material and unit process sequence can be tested for properties related or derived from the structure to be integrated into the commercial product.

This iterative process may continue with larger and more complex test circuits being used for testing different parameters. This approach serves to increase the productivity of the combinatorial screening process by maximizing the effective use of the substrate real estate, and optimizing the corresponding reactor and test circuit design with the level of sophistication required to answer the level of questions necessary per stage of screening. Complex reactors and/or test circuit designs are utilized at later stages of screening when desired properties of the materials, processing conditions, process sequence, etc. are substantially known and/or have been refined via prior stages of screening.

The subsections of test structures generated from previous testing for some screening levels may be incorporated into subsequent, more complex screening levels in order to further evaluate the effectiveness of process sequence integrations and to provide a check and correlation vehicle to the previous screen. It should be appreciated that this ability allows a developer to see how results of the subsequent process differed from the results of the previous process, i.e., take into account process interactions. In one example, materials compatibility may be used as a primary test vehicle in primary screening, then specific structures incorporating those materials (carried forward from the primary screen) are used for the secondary screening. As mentioned herein, the results of the secondary screening may be fed back into the primary screening also. Then, the number and variety of test structures is increased in tertiary screening along with the types of testing, for example, electrical testing may be added or device characterization may be tested to determine whether certain critical parameters are met. Of course, electrical testing is not reserved for tertiary testing as electrical testing may be performed at other screening stages. The critical parameters generally focus on the requirements necessary to integrate the structures created from the materials and process sequence into the commercial product, e.g., a die.

In summary, the embodiments described above provide for a substrate having a backside surface with a modified emissivity profile. Regions of a specified emissivity are deposited on a bottom portion of the substrate, so as to provide and emissivity profile which compensates for thermal non-uniformity of a radiating heat source, thereby promoting thermal uniformity in the substrate. While exemplary substrate backside surface configurations have been listed above, the embodiments are not limited to those configurations as any suitable configuration may be utilized for purposes of achieving thermal uniformity in the substrate.

The above examples are provided for illustrative purposes and not meant to be limiting. The embodiments described herein may be applied to any process sequence to optimize the process sequence, as well as the materials, processes, and processing conditions utilized in the manufacture of a semiconductor device where there exist multiple options for the materials, processes, processing conditions, and process sequences.

The present invention provides greatly improved methods and apparatus for uniformly heating substrates to high temperatures. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

The embodiments described above provide methods and apparatus which are useful for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor manufacturing operations.

Moreover, the embodiments described herein are directed towards delivering precise processing conditions at specific locations of a substrate in order to simulate conventional manufacturing processing operations. Within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through High Productivity Combinatorial (HPC) systems.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

The invention claimed is:

1. A method for heating a substrate, the method comprising:
disposing a substrate above a radiant heat source, wherein a bottom surface of the substrate faces a top surface of the radiant heat source;
heating the radiant heat source, wherein the top surface of the radiant heat source has a non-uniform temperature distribution when heated, wherein a temperature of the top surface of the radiant heat source varies as a function of a radius of the radiant heat source by more than 300K; and
transferring heat from the radiant heat source to the substrate in a uniform manner across the bottom surface of the substrate,
wherein the uniform heat transfer is achieved by having a variable emissivity profile across the bottom surface of the substrate, the variable emissivity profile corresponding to a variable emissivity of the bottom surface of the substrate, a variable emissivity of the top surface of the radiant heat source, or a combination of the variable emissivity of the bottom surface of the substrate and the variable emissivity of the top surface of the radiant heat source.

2. The method of claim 1, wherein heating the radiant heat source comprises inductive heating.

3. The method of claim 1, wherein a temperature of the bottom surface of the substrate varies as a function of the radius of the substrate by less than 100K.

4. The method of claim 1, wherein a temperature of the bottom surface of the substrate varies as a function of the radius of the substrate by less than 10 percent when the substrate is heated to a temperature range of approximately 400 K to 2000 K.

5. The method of claim 1, wherein the bottom surface of the substrate comprises a first region having a first emissivity and a second region having a second emissivity less than the first emissivity.

6. The method of claim 5, wherein the first region comprises one of silicon, silicon oxide, gallium arsenide, silicon nitride, magnesium oxide, or aluminum oxide, and wherein the second region comprises a metallic material.

7. The method of claim 6, wherein the metallic material comprises one of silver, copper, or molybdenum.

8. The method of claim 5, wherein the first region is formed by a substrate base material, and wherein the second region is formed by a film deposited onto the substrate base material.

9. The method of claim 8, wherein the film deposited onto the substrate base material has a thickness of less than 500 nanometers.

10. The method of claim 9, wherein the film deposited onto the substrate base material has a thickness of less than 100 nanometers.

11. The method of claim 5, wherein the first region and the second region have a different surface roughness.

12. The method of claim 5, wherein the first region has a circular shape and wherein the second region has an annular ring shape that is concentric to and surrounds the first region.

13. The method of claim 5, wherein the bottom surface of the substrate further comprises a third region having a third emissivity that is different than the second emissivity.

14. The method of claim 13, wherein the third emissivity is the same as the first emissivity.

15. The method of claim 13, wherein the third emissivity is different from the first emissivity.

16. The method of claim 1, wherein the top surface of the radiant heat source comprises a first source region having a first source emissivity and a second source region having a second source emissivity less than the first source emissivity.

17. The method of claim 16, wherein the bottom surface of the substrate comprises a first substrate region having a first substrate emissivity and a second substrate region having a second substrate emissivity less than the first substrate emissivity.

18. The method of claim 16, wherein the bottom surface of the substrate has a uniform emissivity.

\* \* \* \* \*